United States Patent
Gruber

[11] Patent Number: 5,660,114
[45] Date of Patent: Aug. 26, 1997

[54] TRANSPORT SYSTEM FOR THIN FILM SPUTTERING SYSTEM

[75] Inventor: Thomas A. Gruber, Milpitas, Calif.

[73] Assignee: Seagate Technology, Inc., Scotts Valley, Calif.

[21] Appl. No.: 437,914

[22] Filed: May 10, 1995

[51] Int. Cl.$^6$ .................................................. B61B 13/12
[52] U.S. Cl. .................. 104/168; 104/93; 198/465.4; 198/722; 204/298.25
[58] Field of Search .................. 104/93, 168, 163; 198/465.4, 685, 687.1, 722; 204/192.1, 298.25

[56] References Cited

U.S. PATENT DOCUMENTS

| | | | |
|---|---|---|---|
| 3,610,393 | 10/1971 | Richardson et al. | 198/465.4 X |
| 4,274,936 | 6/1981 | Love | 204/298.25 X |
| 4,368,037 | 1/1983 | Limque et al. | 198/465.4 X |
| 4,765,273 | 8/1988 | Anderle | 204/298.25 X |
| 5,351,808 | 10/1994 | Sundseth | 198/722 X |

Primary Examiner—S. Joseph Morano
Attorney, Agent, or Firm—Fliesler, Dubb, Meyer & Lovejoy LLP

[57] ABSTRACT

A transport drive system for use in a sputtering apparatus, particularly an in-line sputtering apparatus, is disclosed. The system transports a plurality of planar substrates and includes a plurality of transport beams having a C-shaped cross-section. Each transport beam has a first and second end, a first and second sides, a top surface, and a channel, disposed under the top portion, and forming a portion of the C-shaped cross-section. The transport beam includes a substrate carrier which secures the substrate or pallet at the top portion of the substrate or pallet, and which is mounted in an alignment with an off-center relationship with respect to the center of the transport beam. In addition, the system for transporting includes a plurality of drive beams. Each drive beam includes a plurality of horizontally-oriented guide wheels disposed on a top surface of the drive beam, the drive wheels engaging the channel of the transport beam. Each drive beam also includes a plurality of vertically-oriented wheel assemblies disposed in a plurality of U-shaped cavities in the drive beam. A motor is provided with each of the drive beams to drive the vertically-oriented wheel assemblies. A shield, provided below the drive beam, ensures that contamination does not reach the interior of the sputtering chamber.

15 Claims, 5 Drawing Sheets

TRANSPORT SYSTEM FOR THIN FILM SPUTTERING SYSTEM

CROSS-REFERENCE TO RELATED APPLICATIONS

APPARATUS AND METHOD FOR HIGH THROUGHPUT SPUTTERING, U.S. patent application Ser. No. 08/121,959, inventors Dennis R. Hollars, Delbert F. Waltrip, Robert B. Zubeck, Josef Bonigut, Robert M. Smith, and Gary L. Payne, filed Sept. 15, 1993, now abandoned which is a file wrapper continuation of Ser. No. 07/681,866, filed Apr. 4, 1991, now abandoned.

SUBSTRATE TRANSPORT MECHANISM FOR USE IN HIGH THROUGHPUT SPUTTERING MACHINE, U.S. patent application Ser. No. 08/395,074, inventors Dennis R. Hollars, Delbert F. Waltrip, Robert B. Zubeck, Josef Bonigut, Robert M. Smith, Gary L. Payne, filed Feb. 27, 1995, pending which is a divisional application of copending U.S. patent application Ser. No. 08/121,959, filed Sep. 15, 1993, now abandoned which is a continuation application of Ser. No. 07/681,866, filed Apr. 4, 1991, now abandoned.

FIELD OF THE INVENTION

The invention relates to mechanisms for transporting materials through a processing environment, and specifically transporting materials through an in-line sputtering apparatus.

BACKGROUND OF THE INVENTION

Film deposition is a well-known processing technique for depositing thin films on different types of substrates. One technique for depositing thin films is sputtering, which can be advantageously used in the manufacture of magnetic storage media. In film deposition, the maintenance of a controlled environment in which the process occurs is crucial to ensuring the integrity of the deposited film.

Co-pending patent application Ser. No. 08/121,959, published as Publication No. PCT/US92/00722, discloses an in-line sputtering apparatus which is utilized to manufacture magnetic recording media for use in Winchester-type hard disk drives. An integral component of the in-line sputtering apparatus disclosed in publication PCT/US92/00722 is the fact that it utilizes an overhead transport drive system to move substrates through the process environment. The transport system disclosed in publication PCT/US92/00722 is designed to move the substrates through the system in an efficient and flexible manner, while reducing contamination which can result from the interaction of mechanical components in the drive as the substrates are transported through the system.

The evacuated environment of a sputtering chamber such as that utilized in Publication No. PCT/US92/00722 includes an inert gas, typically argon, with one or more substrates remaining static or, as in Publication No. PCT/US92/00722, being transported through the sputtering chamber during deposition. In manufacturing magnetic recording media, the cleanliness of the chamber is critical to ensuring the integrity of the manufactured component. The media must be free from contamination in order to operate effectively, and to optimize the film integrity to allow for higher data capacities in the film and higher storage capacities in the resultant disk drive.

The transport system in Publication No. PCT/US92/00722 is generally referred to as an "overhead" transport apparatus. An overhead apparatus is one that secures and supports at least a majority of the weight of the substrate at the top of the substrate, such that the substrate hangs from the transport mechanism as the substrate is transported through the apparatus. In Publication No. PCT/US92/00722, the transport system supports all of the weight of the pallets at the top of the pallet, so that the pallet hangs from the transport system with its lower portion free. Certain types of transport systems in in-line sputtering apparatus have utilized systems which carry the substrate and support both the top and the bottom portion of the pallet. Generally, overhead drive systems are disfavored in sputtering environments since such systems can generate more particulate contamination than bottom drive systems due to the fact that the drive's mechanical components are above the surface of the substrate, and mechanical interaction between the mechanical components of the drive system can cause contamination to fall on the substrate as the substrate is moved through the system. However, utilizing a top drive system allows the use of larger substrates and substrate-carrying pallets since top drive systems can support weight with greater stability than a bottom drive system.

SUMMARY OF THE INVENTION

The invention comprises a novel overhead-type drive system for use in a sputtering apparatus, particularly an in-line sputtering apparatus. The system for transporting a plurality of planar substrates through an in-line sputtering apparatus includes a plurality of transport beams having a C-shaped cross-section. Each transport beam has a first and second end, a first and second sides, a top surface, and a channel, disposed under the top portion, and forming a portion of the C-shaped cross-section. In addition, the system for transporting includes a plurality of drive beams. Each drive beam includes a plurality of horizontally-oriented guide wheels disposed on a top surface of the drive beam, the drive wheels engaging the channel of the transport beam. Each drive beam also includes a plurality of vertically-oriented wheel assemblies disposed in a plurality of U-shaped cavities in the drive beam. Each wheel assembly includes a cylindrical assembly and an O-ring surrounding the cylindrical assembly. The drive beams also include a chain assembly coupled to each of the cylindrical assemblies, to couple the cylindrical assemblies to each other. A motor is provided with each of the drive beams to drive the chain assembly and consequently the vertically-oriented wheel assemblies.

An additional feature of the invention includes a shield, provided below the drive beam, to ensure that contamination does not reach the interior of the sputtering chamber. Each of the drive beams is provided in one of a plurality of sputtering chambers in a sputtering apparatus. The drive beam is approximately the length of the chamber, and the transport beams are approximately the length of the drive beam.

The transport beam includes a substrate carrier which secures the substrate or pallet at the top portion of the substrate or pallet, and which is mounted in an alignment with an off-center relationship with respect to the center of the transport beam.

Thus, an advantage of the invention is that reduced parts are required to provide a more stable transport assembly than that disclosed in the prior art. The transport mechanism is easier to assemble and disassemble, and fewer mechanical parts result in fewer mechanical breakdowns in the transport assembly. Improved shielding results in less particulate contamination which can reach the process environment.

BRIEF DESCRIPTION OF THE DRAWINGS

The invention will be described with respect to the particular embodiments thereof. Other objects, features, and advantages of the invention will become apparent with reference to the specification and drawings in which.

WRITTEN DESCRIPTION

Figures 1A, 1B:
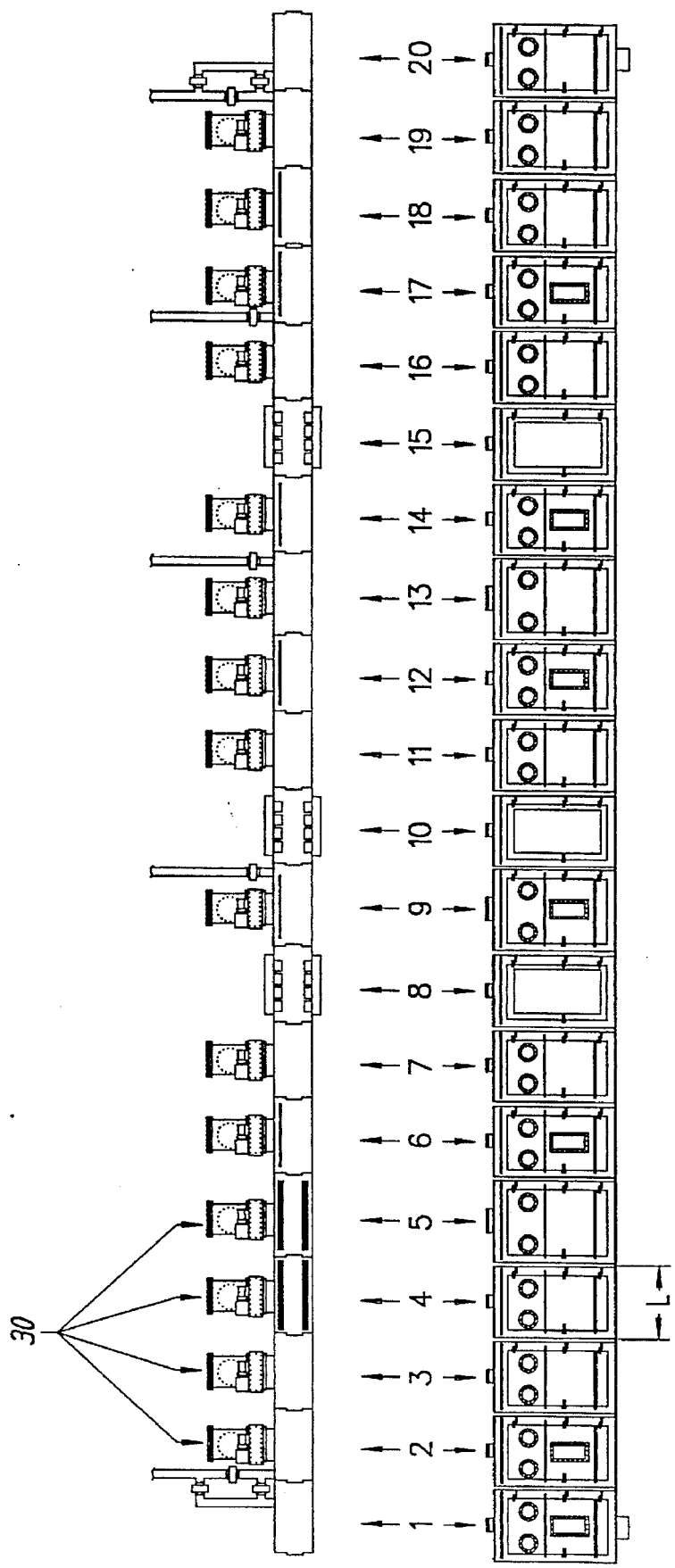
FIG. 1A and 1B are a top view and side view, respectively, of an in-line sputtering apparatus in which the transport system of the present invention is suitable for use.

An exemplary deposition apparatus 100, in which the transport system of the present invention is suitable for use and which is similar to that disclosed in application PCT/US92/00722 is shown in FIGS. 1A and 1B. In general, the steps involved in depositing films on a substrate by sputtering include: providing substrates in an evacuated system wherein chambers of the sputtering system are maintained at a pressure of approximately $10^{-7}$ Torr and backfilled with a suitable sputtering gas, such as argon; heating the substrates to a temperature conducive to optimal film deposition; and sputtering the films to be deposited on the substrates.

As used herein, the term "substrate" generally refers to a disk substrate to which magnetic and coating films are applied and the term "pallet" refers to a disk carrier, such as those disclosed in application Ser. No. 08/121,959. As such, a number of substrates may be transported on pallets through the system. However, it should be understood that the terms "substrate" and "pallet" should not be read as limiting the use of the invention described herein to a pallet carrying multiple substrates. The invention, and apparatus 100, may, for example, be utilized to process a single sheet, planar substrate, such as glass, with films being applied directly thereto.

Deposition apparatus 100, used to apply a single or multilayer film to one or more substrates, will be discussed with reference to FIGS. 1A and 1B.

Generally, substrates are provided through multiple sputtering chambers 8, 10, and 15 in apparatus 100 at a rate of speed ranging from about 3–6 feet/minute, in an evacuated environment after having been heated by soak heater provided in chamber 4 and passby heater provided in chamber 5. The apparatus may transport substrates at speeds generally ranging from 0–12 feet per minute through various chambers, depending upon the process occurring in the chamber.

While deposition apparatus 100 described in PCT/US92/00722 includes seventeen (17) chamber modules, apparatus 100 includes 20 chamber modules generally comprised of two basic types: process modules and pumping modules, each having similar construction.

Isolation doors are located between specific chamber modules 1, 2, 3, 4, 5, 6; 8, 9, 10; 13, 14, 15; and 17, 18, 19, 20 of deposition apparatus 100 as shown in FIGS. 1A–1B. The doors may comprise slit values which are pneumatically operated by a computer control system to enable sequential process flow of substrates and isolation for specific processes occurring in each chamber.

In apparatus 100 shown in FIGS. 1A–1B, load lock chamber 1 functions as an isolation chamber between the ambient, sputtering environment and chambers 2–17 of deposition apparatus 100. Load lock chamber 1 is repeatedly evacuated to a pressure of approximately 50 Mtorr and vented to ambient atmospheric conditions. Generally, deposition within apparatus 100 takes place in an evacuated environment and chambers 2–17 are evacuated to the pressure of approximately $10^{-7}$ Torr, before argon gas is allowed to flow into the chambers to achieve a suitable sputtering pressure.

Chamber 2 serves as an entrance buffer between load lock chamber 1 and the internal sputtering environment in chambers 3–17; chamber 3 is a second buffer chamber which may optionally be used to provide a dry or wet etch to the substrates before further processing. Chamber 4 serves as a soak heating chamber for increasing the substrate temperature to optimize film deposition. Substrates are moved into chamber 4, which includes eight banks of quartz lamp heating elements, four banks mounted to each outer door, and remain idle therein for a period of time prior to further processing.

Passby heating chamber 5 includes a heating assembly comprising additional banks of quartz lamp heating elements, five mounted to each outer door of the chamber. Substrates pass through chamber 5 and are heated while in motion therethrough. Both soak heater 4 and passby heating chamber 5 are designed to insure uniform substrate temperature prior to film deposition.

Three coating modules—chromium deposition chamber 8, magnetic deposition chamber 10, and carbon deposition chamber 15—having dimensions roughly equal to those of load lock chamber 1, may be utilized to sputter single or multilayer films on a substrate passing through apparatus 100. Four pairs of sputtering cathodes are mounted, four magnetrons per door, on the doors of each chamber 8, 10, and 15, respectively. Target materials are mounted to the sputtering cathodes; gas manifolds, and shielding are also attached to the outer doors of chambers 8, 10, and 15. Mounting these components to the doors facilitates target changes and chamber maintenance. Further, conduits (not shown) for power, cooling, and process gas lines are provided in the outer doors of the chambers.

Chamber 9 is a buffer chamber between chambers 8 and 10, and may optionally include a second bank of pass-by heaters.

Two exit buffer modules 18 and 19 are provided and are essentially identical to buffer 2. Exit buffer modules 18, 19 provide a buffer area to facilitate removal of pallets or substrates from sputtering apparatus 100 to exit lock chamber 20 and further isolates the sputtering process from the external environment.

Exit lock chamber 20 is essentially identical to load lock chamber 1 and operates in reverse pumping order, allowing substrates to be transferred from the evacuated environment of sputtering apparatus 100, to the ambient external environment.

Apparatus 100 incorporates a highly efficient, high capacity vacuum pump system. The vacuum pump system must furnish and maintain an evacuated environment at about $10^{-7}$ Torr to ensure substantially unobstructed paths between the bombarding species and the target surface, and between dislodged target species and the substrates.

The vacuum pump system comprises a combination of five turbo-molecular pumps with mechanical and blower pumps for backing. The mechanical pumping system is set up with multiple mechanical pump and blower combinations. Three pumps are needed at all times for the entrance lock, exit lock and turbo-pump backing. Two pumps may be held in reserve. In addition, base pressure pump down and water vapor pumping are expedited using cryogenic coils and a Polycold® refrigeration generator. Two coils or "top hats" 30 per circuit are used. The vacuum system also features a network of valves. Chamber vent valves are used to vent the internal environment of sputtering apparatus 100 to atmosphere. Roughing valves and foreline valves isolate the mechanical pumps from sputtering apparatus 100. The valves allow apparatus 100 to be divided into five separate pumping sections, such that each individual section can be vented and pumped down as desired, to facilitate maintenance of apparatus 100. High vacuum valves allow controlled pump-down deposition apparatus 100 from atmospheric pressure. Foreline valves isolate one or more of the five mechanical pumps from the pumping system conduits, allowing flexibility in the number of mechanical pumps operating at a given time. The valves may be arranged such that any one pump can be coupled to pump any given section of apparatus 100 and any one mechanical pump/blower can replace any other mechanical pump/blower that is shut down without disrupting processing.

Additional position sensors (not shown) are provided on a return path (not shown) which circulates pallets from the output of apparatus 100 (at chamber 20) to the input of apparatus 100 (at chamber 1).

A gas flow control system includes valves and valve controls for the sputtering gas (for example, argon), which is supplied to apparatus 100 to create a sputtering environment in the deposition chambers. In conjunction with gas flow control system, gas pressure is monitored as a component of the internal system pressure in apparatus 100 through a series capacitance manometers.

Power supplies are provided to generate sputtering from the sputtering cathode assemblies in chambers 8, 10, and 15.

Circulating coolant fluid, such as water, is provided to heaters, sputtering shields, and sputtering cathodes to maintain temperatures within acceptable operating levels during production and to prevent rapid deterioration of these system components. A coolant control sub-system monitors the temperature level of the coolant in the coolant system and controls the open/close states of coolant flow control valves.

A transport system suitable for use with apparatus 100 utilizes a plurality of individually powered transport platforms. Each of the transport stages is about equivalent in length to the length of a chamber. Each transport platform may be individually controlled with respect to direction and speed by controlling a motor assembly (not shown) associated with each platform. Hence, the transport speed of each individual platform can be controlled at varying rates separate and apart from the speed of other platforms. Each transport platform is provided with proximity sensors at the input, midpoint and output of the chamber (not shown) which provide pallet position signals to the electronic control system utilized with apparatus 100. This allows the electronic control system and the system operator to identify the location of each and every substrate in deposition apparatus 100 and along a return path (not shown) at any given time. Three such proximity sensors per transport platform are provided for each of the platforms used in conjunction with deposition apparatus 100. Each sensor provides a digital output signal to indicate the presence or absence of a substrate at the sensor's position.

Figure 2:
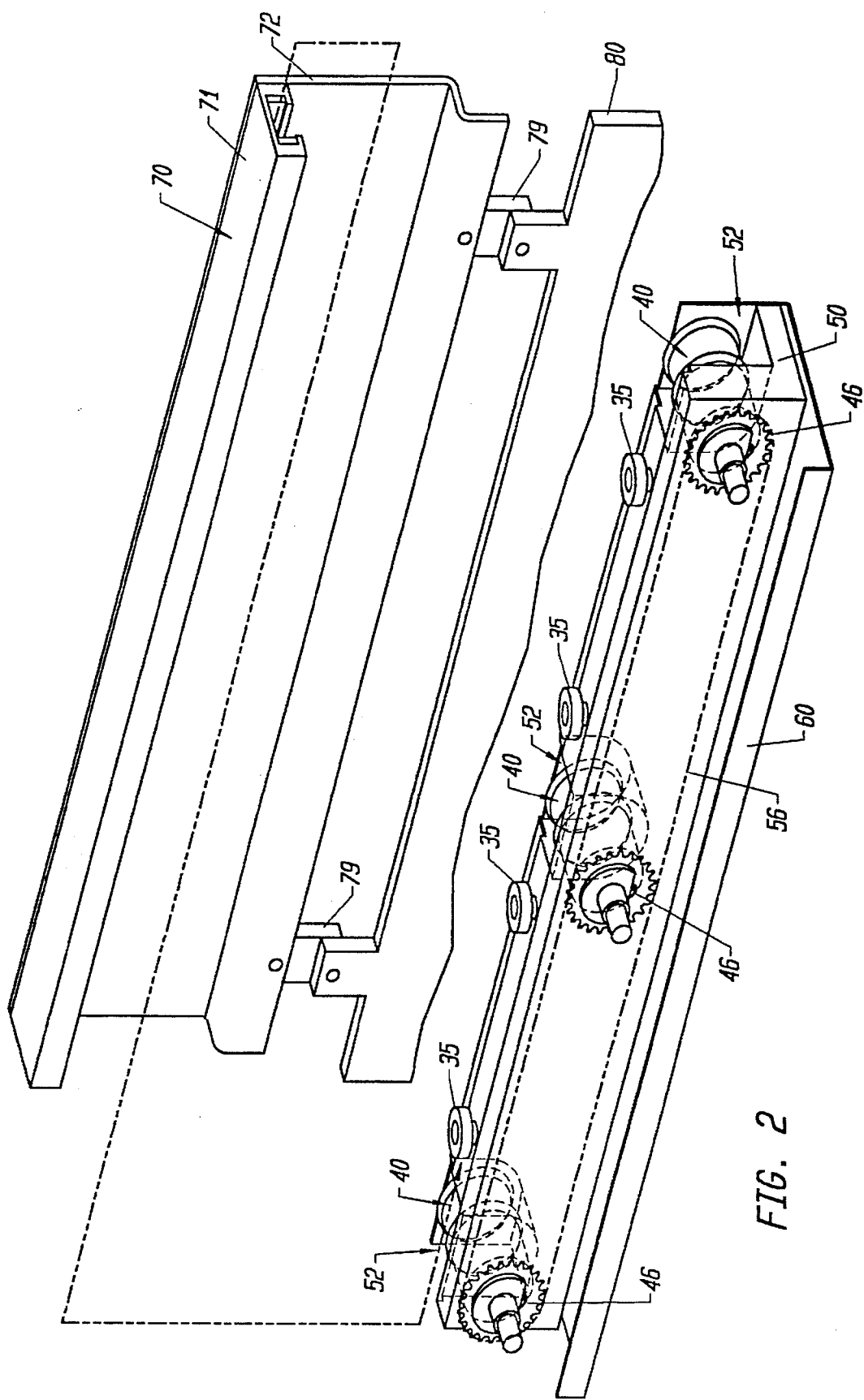
FIG. 2 is a perspective view of an assembled transport beam and drive beam assembly in accordance with the present invention.
Figure 3:
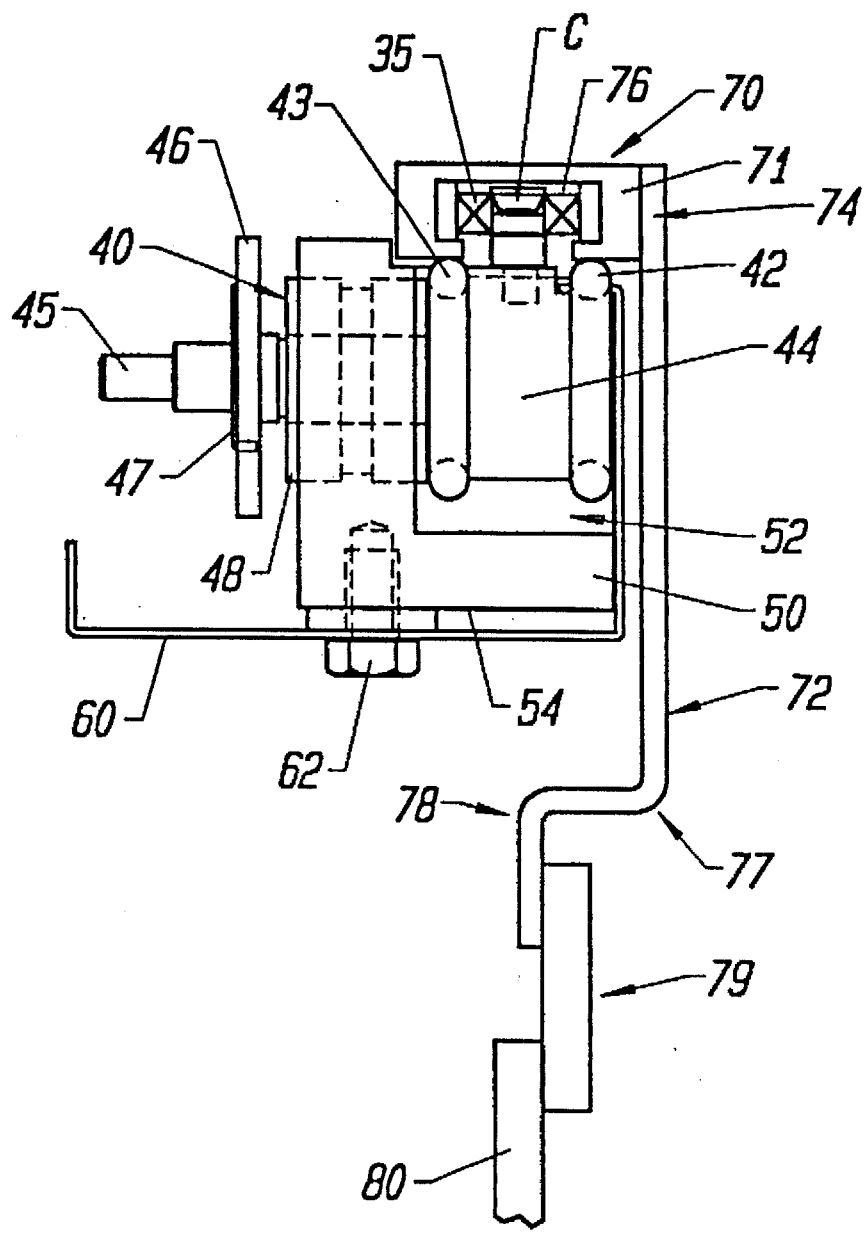
FIG. 3 is a cross-sectional view of an assembled transport beam and drive beam in accordance with the teachings of the present invention.

The transport system utilized to move substrates through apparatus 100 will be described with reference to FIGS. 2 through 6. FIG. 2 is a perspective view of the transport beam assembly in accordance with the present invention. FIG. 3 is a cross-sectional view along line 3—3 in FIG. 2.

As shown in FIGS. 2 and 3, and with reference to FIGS. 1A and 1B, the drive system for the apparatus 100 consists of a series of independent drive beams 50 which pass a transport beam 70 from one chamber to another. Unless otherwise noted, all parts described herein may be comprised of series 304 stainless steel. The particular composition of the material of the parts is selected so that the thermal expansion of the drive system will be the same as apparatus 100. A drive beam 50 is located in each chamber module 1 through 20 of apparatus 100. Drive beam 50 has a length equalling approximately the same length (L as shown in FIG. 1) of each chamber of apparatus 100. It should be noted that the length L of each chamber in the apparatus is approximately the same, and thus the length of each drive beam 50 is also approximately the same as all drive beams in the system.

Transport beam assembly 70 includes a transport beam 71 and a pallet mounting bracket 72 which is mounted to a first side 74 of transport beam 71. As shown in FIG. 3, transport beam 70 rests upon rubber O-rings 42, 43 which are secured on a cylindrical member 44 comprising a portion of wheel assembly 40. As shown in FIG. 2, in one embodiment, three wheel assemblies 40 are provided in drive beam 50, with the wheel assemblies 40 being mounted in cavities 52 in drive beam 50.

A number of horizontally oriented guide wheels 35 are mounted on the top surface of drive beam 50. As shown in FIG. 3, each guide wheel fits in a channel 76 which defines a (sideward facing) C-shaped cross-section of transport beam 71. A shield 60 is mounted to the bottom 54 of drive beam 50 by one or more hex screws 62 and a mount pin 64. Guide wheels 35 can comprise ball bearings.

Figure 6:
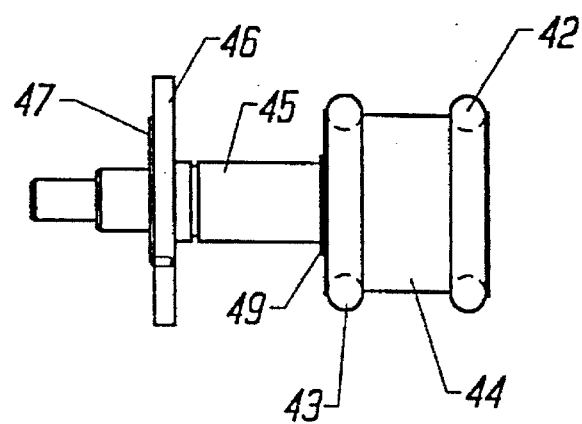
FIG. 6 is a plan view of a wheel assembly utilized in the drive beam shown in FIG. 4 in accordance with the teachings of the present invention.

As shown in FIG. 6, wheel assembly 40 includes a drive shaft 45 and cylindrical member 44 which are manufactured as a single, integrated piece by, for example, machining a piece of stainless steel. A sprocket 46 is secured to shaft 45 by a drive washer 47. Wheel assembly 40 also includes a ball bearing 48 which is secured in a bore adjacent to cavity 52 and which allows drive shaft 45 to rotate, while supporting drive shaft 45 and cylindrical member 44 with sprocket 46. A drive washer 49 is secured on shaft 45 by means of threads on shaft 45, onto which drive washer 49 rotates. Alternatively, washer 49 may be secured on shaft 45 by a snap ring (not shown), with an appropriate groove for the snap ring formed into shaft 45.

Figure 4:
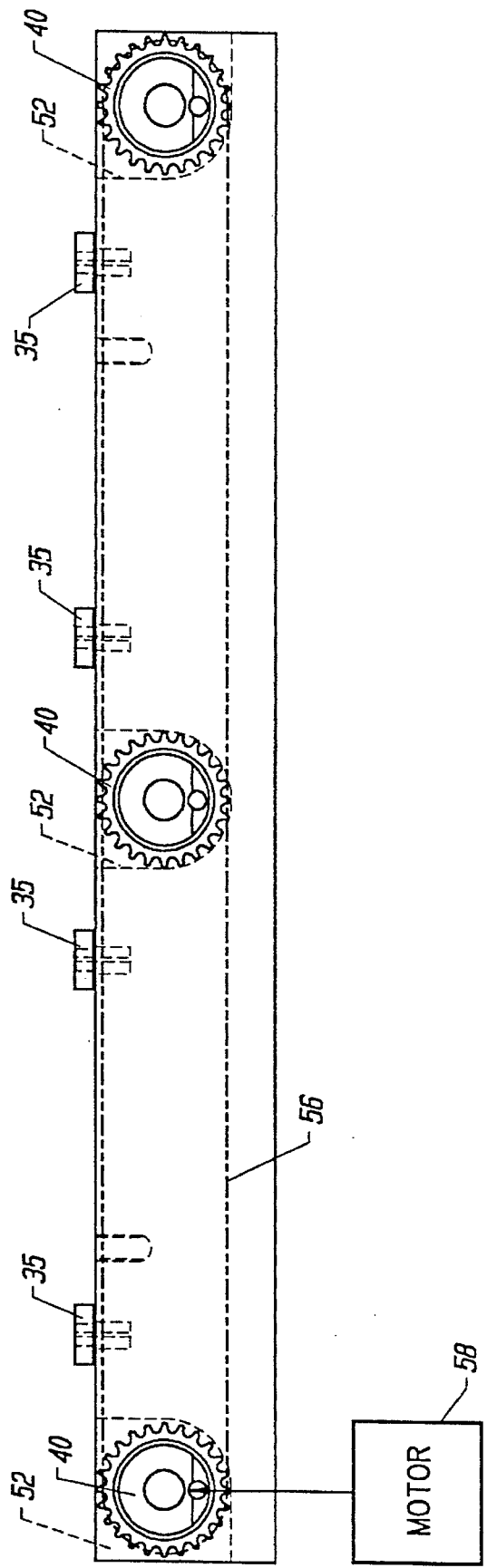
FIG. 4 is a partial assembly side view of a drive beam of the transport mechanism of the present invention.
Figure 5:
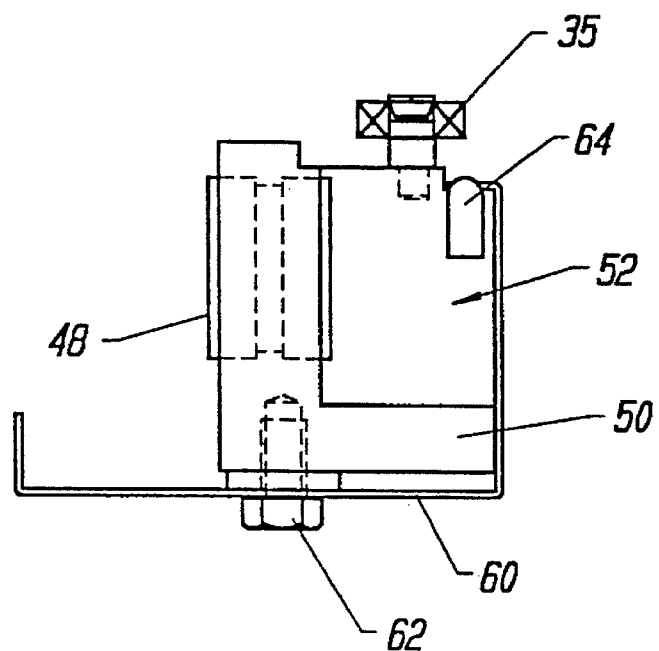
FIG. 5 is a partial assembly cross-section of a drive beam shown in FIG. 4 in accordance with the present invention.

The sprocket 46 of each wheel assembly 40 is coupled by a drive chain 56 as shown in FIG. 4. A motor 58 is coupled to drive chain 56 as represented in block form in FIG. 4. Thus, a single motor drives each of the wheel assemblies, and a motor is associated with each one of the drive beams utilized in each of the chambers of the apparatus 100.

As shown in FIG. 3, the transport beam 71 rests on O-rings 42 and 43 of wheel assembly 40. The pallet bracket 72 includes first and second bends 77 and 78, respectively, so that a pallet 80 hanging from the transport assembly will be centered with respect to transport beam 71. Also shown in FIG. 3 is an insulator member 79, comprised of ceramic, which secures to bracket 72, and from which pallet 80 hangs.

In operation, motor 58 drives the wheel assemblies 40 on drive beam 50. A transport member assembly 70 is transported from drive beam to drive beam in succession by the weight of the assembly incident upon the O-rings 42, 43 on each wheel assembly 40. The speed of each motor 58 with respect to each drive beam is independently adjustable so that any number of dynamic speeds may be utilized to move the transport beam assembly 70 along the path between chambers 1 through 20 of apparatus 100, and along a return path (not shown) between chamber 20 and chamber 1.

Several advantages accompany the design shown in FIGS. 2 through 6. The use of a single shield 60 (as opposed to two shields in PCT/US92/00722), a single chain assembly, a single set of guide wheels, and integrated wheel assemblies, reduces the number of parts, and thereby reduces the cost of the device and greatly simplifies maintenance. Because each wheel assembly includes an integral shaft and cylindrical member, the possibility of breakdown in the drive wheels is substantially reduced. The present invention also allows the elimination of set screws to mount the shafts in the assembly, which again decreases the number of parts and reduces breakdowns.

The current design also substantially reduces the possibility that the drive sprockets will spin on a drive shaft. Because the drive washer engages a sprocket via a tab which projects through the sprocket and transmits torque to the wheel shaft via flats on the shaft, the possibility for the sprocket spinning on the drive shaft is also substantially reduced.

A further unique aspect of the present invention is the fact that the shield assembly covers the entire underside of the drive beam assembly. Thus, there is a less-exposed area for particulate matter generated by mechanical parts to fall onto the pallet 80. As should be also noted, pallet 80 aligns with the center C of transport beam 71.

Thus, while the transport beam is centered with respect to the cylindrical member 44, the off-center relationship of the pallet hanger 72 allows for the use of the integral transport assemblies, and a generally simpler transport beam structure.

The various objects and advantages of the present invention will be apparent to those of average skill in the art. Numerous modifications to the drive system of the present invention will be obvious to those skilled in the art. As should be generally understood, use of the transport system of the present invention is not limited to use with a thin film deposition apparatus, but could be utilized in any number of systems wherein contaminant-free transport is required. All modifications are intended to be within the scope of the invention as disclosed in the instant specification, the drawings, and the following claims.

What is claimed is:

1. An overhead transport assembly for carrying substrates in a sputtering apparatus, comprising:

a drive beam, secured to the apparatus;

a plurality of transport wheel assemblies mounted in the drive beam;

means for driving the wheel assemblies;

a carrier beam assembly, the carrier beam assembly including a transport beam having a c-shaped cross section defining a channel and a substrate coupling bracket coupled to the transport beam;

wherein the drive beam includes at least one horizontally-oriented guide wheel disposed on a top surface of the drive beam, the guide wheel engaging the channel of the carrier beam; and the transport wheel assemblies are vertically oriented and disposed in a plurality of cavities in the drive beam, the wheel assemblies comprising a cylinder and an o-ring, surrounding the cylinder, with the wheel assemblies supporting the transport beam.

2. The assembly of claim 1 further including a shield means coupled below the drive beam.

3. The assembly of claim 1 wherein the substrates are carried on a pallet bracket, and the transport beam includes a first side and a second side, and a top surface, an axis defined as a line parallel to and centered between the first and second sides, the pallet bracket having a first end attached to the second side of the transport beam and a second end, the pallet bracket having a shape such that the center of mass of the pallet bracket and the transport beam with the substrate attached is located along the axis.

4. The assembly of claim 1 wherein the substrate coupling bracket includes a first end attached to a first side of the transport beam and a second end, the second end of the substrate coupling bracket having an offset relationship with respect to the first end of the substrate coupling bracket such that the second end of the substrate coupling bracket aligns in a vertical plane with the transport beam.

5. The assembly of claim 1 further including a ceramic insulator provided between the substrate coupling bracket and a substrate coupled thereto.

6. The assembly of claim 1 further including a shield, coupled to the drive beam, between the drive beam and a substrate coupled to the carrier beam assembly.

7. A transport assembly as recited in claim 1 wherein each said wheel assembly further includes a shaft and a sprocket, and said shaft is coupled to said cylinder.

8. A transport assembly as recited in claim 1, wherein said carrier beam assembly further includes an insulating member for preventing transmission of thermal and electrical energy between said transport beam and a substrate coupled to the insulating member.

9. The transport assembly as recited in claim 1, wherein said means for driving the wheel assemblies comprises:

a motor associated with the drive beam for supplying power to said
    wheel assemblies.

10. A transport assembly as recited in claim 1, further comprising a shield affixed to said drive beam between said drive beam and a substrate coupled from said coupling bracket.

11. A system for transporting a plurality of planar pallets through an in-line sputtering apparatus, comprising:

a plurality of transport beams having a c-shaped cross-section, each having a first and second ends, a first side and a second side, a top surface, and a channel disposed below said top surface;

a plurality of drive beams, the drive beam including
        a plurality of horizontally-oriented guide wheels disposed on a top surface of the drive beam, the guide wheels engaging the channel of the transport beam;
        a plurality of vertically oriented wheel assemblies disposed in a plurality of cavities in the drive beam, the wheel assemblies comprising a cylindrical assembly and an o-ring, surrounding the cylinder, the wheel assemblies supporting the transport beam;
        a chain assembly coupled to said cylindrical assembly; and
    a plurality of motors, one of said plurality being coupled to the chain assembly to drive the assembly and the wheel assemblies and the inverted beam through the drive beam.

12. The system as recited in claim 11 wherein an insulator is provided on the transport beam for coupling the beam to a substrate.

13. The system as recited in claim 12 wherein the insulator is comprised of ceramic.

14. A transport system as recited in claim 11, wherein one of said plurality of transport mechanisms comprises:

a motor for supplying power to said transport mechanism;

a plurality of wheel assemblies, said motor supplying power to said plurality of wheel assemblies to rotate said plurality of wheel assemblies; and mounting means on said beam carrier to which said substrate-carrying pallet is mounted, said mounting means coupled to one of said beam carriers and supported by said one of said beam carriers such that said substrate-carrying pallet is transported through a chamber of the plurality of chambers by the rotation of said at least one wheel against said mounting means.

15. The system for transporting as claimed in claim 11 wherein each of said plurality of substrates is transferred between a first velocity and a second velocity on multiple occasions between a first and a second ends of the apparatus.

* * * * *